US011862928B2

(12) United States Patent
Hassan et al.

(10) Patent No.: US 11,862,928 B2
(45) Date of Patent: Jan. 2, 2024

(54) HYBRID LASER SOURCE COMPRISING AN INTEGRATED WAVEGUIDE CONTAINING AN INTERMEDIATE BRAGG GRATING

(71) Applicant: Commissariat a l'Energie Atomique et aux Energies Alternatives, Paris (FR)

(72) Inventors: Karim Hassan, Grenoble (FR); Laetitia Adelmini, Grenoble (FR); Bertrand Szelag, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 203 days.

(21) Appl. No.: 16/939,108

(22) Filed: Jul. 27, 2020

(65) Prior Publication Data
US 2021/0036488 A1 Feb. 4, 2021

(30) Foreign Application Priority Data
Jul. 29, 2019 (FR) ..................................... 19 08625

(51) Int. Cl.
*H01S 5/02* (2006.01)
*H01S 5/10* (2021.01)
*H01S 5/125* (2006.01)
*H01S 5/12* (2021.01)

(52) U.S. Cl.
CPC ............ *H01S 5/021* (2013.01); *H01S 5/0218* (2013.01); *H01S 5/1032* (2013.01); *H01S 5/1231* (2013.01); *H01S 5/125* (2013.01)

(58) Field of Classification Search
CPC ...... H01S 5/021; H01S 5/0218; H01S 5/1032; H01S 5/12–125; H01S 5/1231
See application file for complete search history.

(56) References Cited

U.S. PATENT DOCUMENTS

| 2005/0048409 A1* | 3/2005 | Elqaq | G02B 6/124 |
| | | | 430/315 |
| 2010/0040100 A1* | 2/2010 | Takada | H01S 5/12 |
| | | | 372/45.01 |
| 2011/0267676 A1* | 11/2011 | Dallesasse | H01S 5/021 |
| | | | 359/279 |

(Continued)

FOREIGN PATENT DOCUMENTS

| EP | 2 988 378 A1 | 2/2016 |
| FR | 3 061 961 A1 | 7/2018 |

OTHER PUBLICATIONS

French Preliminary Search Report dated Apr. 29, 2020 in French Application 19 08625 filed on Jul. 29, 2019 (with English Translation of Categories of Cited Documents & Written Opinion), citing documents AA-AC, AO-AP & AW-AZ therein, 12 pages.

(Continued)

*Primary Examiner* — Sean P Hagan
(74) *Attorney, Agent, or Firm* — Oblon, McClelland, Maier & Neustadt, L.L.P.

(57) ABSTRACT

A laser source includes a semiconductor pad containing an active waveguide arranged on a functionalized substrate having an integrated waveguide. The integrated waveguide is formed from a stack of a first portion and of a second portion. A Bragg grating is arranged in the first portion and is covered by the second portion.

19 Claims, 9 Drawing Sheets

(56) References Cited

U.S. PATENT DOCUMENTS

| | | | | |
|---|---|---|---|---|
| 2013/0259077 | A1* | 10/2013 | Ben Bakir | H01S 5/125 |
| | | | | 372/44.01 |
| 2014/0369700 | A1* | 12/2014 | Debregeas-Sillard | |
| | | | | H01S 5/0622 |
| | | | | 438/31 |
| 2015/0270684 | A1* | 9/2015 | Suzuki | H01S 5/1032 |
| | | | | 372/45.01 |
| 2015/0303653 | A1* | 10/2015 | Tanaka | H01S 5/0078 |
| | | | | 372/7 |
| 2016/0036201 | A1* | 2/2016 | Takiguchi | G02B 27/286 |
| | | | | 372/45.01 |
| 2016/0056612 | A1* | 2/2016 | Ferrotti | H01S 5/1032 |
| | | | | 438/31 |
| 2017/0214216 | A1* | 7/2017 | Dong | H01S 3/0637 |
| 2018/0212399 | A1 | 7/2018 | Menezo et al. | |
| 2018/0278021 | A1 | 9/2018 | Ferrotti et al. | |

OTHER PUBLICATIONS

Ferrotti et al., "O-Band III-V-on-Amorphous-Silicon Lasers Integrated With a Surface Grating Coupler", IEEE Photonics Technology Letters, vol. 28, No. 18, Sep. 15, 2016, 4 pages.

Duprez et al., "Heterogeneously Integrated III-V on Silicon Distributed Feedback Lasers at 1310 nm", 2015 Optical Fiber Communications Conference and Exhibition (OFC), OSA, Mar. 22, 2015, 3 pages.

Dong et al., "Novel integration technique for silicon/III-V hybrid laser", Optics Express, vol. 22, No. 22, Oct. 21, 2014, 8 pages.

Szelag et al., "Hybrid III-V/Silicon Technology for Laser Integration on a 200-nm Fully CMOS-Compatible Silicon Photonics Platform", IEEE Journal of Selected Topics in Quantum Electronics, vol. 25, No. 5, Sep. 1, 2019, 10 pages.

* cited by examiner

HYBRID LASER SOURCE COMPRISING AN INTEGRATED WAVEGUIDE CONTAINING AN INTERMEDIATE BRAGG GRATING

TECHNICAL FIELD

The field of the invention is that of semiconductor laser sources, and more precisely of so-called hybrid laser sources, i.e. sources the optical cavity of which is defined by at least one Bragg grating located in a functionalized substrate, an SOI substrate for example, to which a semiconductor pad, for example a III-V semiconductor pad containing the gain medium, has been added.

PRIOR ART

Generally, a photonic chip comprises at least one optoelectronic component, a laser source for example, that rests on a substrate that is said to be functionalized in so far as it comprises an integrated photonic substrate. Such an integrated photonic circuit comprises a waveguide, coupled to the laser source, and active optical components (modulators, etc.) and/or passive optical components (multiplexers, etc.). In the case of photonics-on-silicon technologies, the laser source is based on a semiconductor compound that may, for example, be a III-V compound such as InP, and the functionalized substrate may be a silicon-on-insulator (SOI) substrate incorporating silicon waveguides.

The laser source is said to be hybrid in so far as the optical cavity of the laser source is defined by reflectors located in the functionalized substrate. More precisely, the laser source is formed from a semiconductor pad made of a III-V compound that contains the gain medium. The gain medium is located in a waveguide referred to as the active waveguide. In the case of a distributed-Bragg-reflector (DBR) laser, the optical cavity is bounded by two Bragg gratings located in the integrated waveguide, which form wavelength-selective mirrors. In the case of a distributed-feedback (DFB) laser, a given Bragg grating extends, in the integrated waveguide, the entire length of the optical cavity.

FIGS. 1A and 1B are cross-sectional views of an example of the DFB III-V/Si hybrid laser source described in the article by Szelag et al. entitled *Hybrid III-V/Si DFB laser integration on a 200 mm fully CMOS-compatible silicon photonics platform*, 2017 IEEE International Electron Devices Meeting (IEDM), January 2018. The laser source 1 is formed from a semiconductor pad 10 based on InP containing a quantum-well layer 11 located between two doped semiconductor layers 13.1, 13.2 and arranged in the active waveguide 12. Moreover, the functionalized substrate 20 comprises the integrated waveguide 22 made of silicon, which here corresponds to a rib waveguide formed from a first portion 23, here a slab, on which rests a second portion 24, here a longitudinal rib. In this example, the slab 23 has a constant thickness of about 300 nm in the functionalized substrate 20, i.e. in and beyond the region of coupling to the semiconductor pad 10. Furthermore, the longitudinal rib 24 is present solely in the region of coupling to the semiconductor pad 10, and has a thickness of about 200 nm. Thus, the integrated waveguide 22 has, in the coupling region, a thickness of about 500 nm, so as to optimize the optical coupling between the two waveguides 12, 22. The Bragg grating 2 is conventionally located on the upper face of the longitudinal rib 24.

It will be noted that the article by Ferrotti et al. entitled *O-Band III-V-on-Amorphous-Silicon Lasers Integrated With a Surface Grating Coupler*, IEEE Photonics Technology Letters, Vol. 28, No. 18, p. 1944-1947, 2016, describes a DFB hybrid laser source similar to that described above, the integrated waveguide of which comprises a Bragg grating located on the upper face of the longitudinal rib.

In one approach, the process for fabricating such a laser source may comprise providing an SOI substrate the layer of single-crystal silicon of which has a constant thickness of 500 nm. The process then comprises a step of etching the single-crystal silicon locally so as to keep a thickness of about 500 nm in the region of coupling to the III-V semiconductor pad, and to decrease this thickness to about 300 nm outside of the coupling region. However, it is tricky to precisely control the thickness of the integrated waveguide in the etched region. Furthermore, the surface finish of the integrated waveguide in the etched region may induce optical losses.

In another approach (described in the article Szelag et al. 2018), the fabricating process comprises producing the slab from a layer of single-crystal silicon of a thickness of about 300 nm of an SOI substrate, then producing a longitudinal rib of a thickness of about 200 nm using a damascene process (deposition of amorphous silicon then chemical-mechanical polishing). Thus, the integrated waveguide is mainly formed from the single-crystal silicon slab of 300 nm thickness obtained from the SOI substrate and from the longitudinal rib made of amorphous silicon of 200 nm thickness. Thus, the integrated waveguide has the required local thickness of about 500 nm under the active waveguide, this improving the optical coupling between the two waveguides, but keeps a thickness of about 300 nm outside of the region of coupling to the III-V semiconductor pad, this thickness of 300 nm being propitious to the various optical functions performed by the integrated photonic circuit. The degradation of the optical properties of the integrated waveguide in the aforementioned localized etching step is thus limited.

However, there is a need for a hybrid laser source the integrated waveguide of which comprises two longitudinal portions arranged one on top of the other and at least one Bragg grating, and the desired performance of which remains unaltered during the implementation of the fabricating process.

DESCRIPTION OF THE INVENTION

The objective of the invention is to at least partially remedy the drawbacks of the prior art, and more particularly to provide a hybrid laser source the desired performance of which is unaltered or is even improved during the implemented fabricating process.

To this end, one subject of the invention is a laser source, comprising a substrate, referred to as the functionalized substrate, comprising a waveguide, referred to as the integrated waveguide. The latter is formed from a stack of a first portion and of a second portion, an upper face of the first portion being at least partially coated with a second portion, and comprises at least one Bragg grating. The laser source furthermore comprises a semiconductor pad, resting on the functionalized substrate, comprising a gain medium located in a waveguide that is referred to as the active waveguide, the active waveguide being located perpendicular to the integrated waveguide and oriented parallel thereto, the two waveguides being optically coupled to each other. According to the invention, the Bragg grating is located in the upper face of the first portion, and is covered by the second portion.

The following are certain preferred but non-limiting aspects of this laser source.

The Bragg grating is advantageously formed by a periodic alternation of teeth (peaks) and troughs, the troughs being filled with a material of low refractive index, the refractive index of which is lower than the refractive index of the first and second portions.

The second portion advantageously rests on a substantially planar surface.

The integrated waveguide may be made of silicon and is encircled by a silicon oxide. The Bragg grating may comprise troughs filled with a silicon oxide or with a silicon nitride.

The first portion of the integrated waveguide may be made of crystalline silicon, and the second portion may be made of amorphous silicon.

The Bragg grating may comprise a periodic alternation of teeth and troughs, the second portion making contact with the teeth of the Bragg grating.

The Bragg grating may comprise a periodic alternation of teeth and troughs, the integrated waveguide comprising a thin continuous layer made of a material of low refractive index that covers the first portion and fills the troughs of the Bragg grating, the second portion being spaced apart from the first portion by the thin continuous layer.

The second portion may form a longitudinal rib of a width smaller than that of the first portion.

The invention also relates to a process for fabricating a laser source according to any one of the preceding features. The process comprises the following steps:
  producing a first portion of the integrated waveguide resting on a base layer;
  producing at least one Bragg grating in the upper face of the first portion opposite the base layer, the Bragg grating being formed from an alternation of teeth and troughs;
  filling the troughs with a material of low refractive index;
  producing a second portion of the integrated waveguide on the first portion and covering the Bragg grating;
  producing an upper layer covering the second portion; and
  producing the semiconductor pad resting on the upper layer.

The step of producing the first portion may be performed by locally etching a layer of crystalline silicon of an SOI substrate, the first portion having a spatially uniform thickness equal to the thickness of the layer of crystalline silicon.

The step of producing the second portion of the integrated waveguide may be performed using a damascene process comprising the following steps:
  producing a layer forming a mask and covering the first portion and the Bragg grating;
  producing a longitudinal aperture perpendicular to the Bragg grating;
  depositing amorphous silicon filling the longitudinal aperture; and
  carrying out chemical-mechanical planarization so as to free an upper face of the mask and to preserve the amorphous silicon filling the longitudinal aperture.

The Bragg grating may be formed from a periodic alternation of teeth and troughs. Following the step of producing the longitudinal aperture, a surface of the upper face of the first portion may be rendered free, said free surface being formed by teeth made of silicon and by the material of low refractive index filling the troughs of the Bragg grating.

The Bragg grating may be formed from a periodic alternation of teeth and troughs. Following the step of producing the longitudinal aperture, a thin continuous layer of the layer made of silicon oxide may cover the teeth made of silicon and may fill the troughs of the Bragg grating.

BRIEF DESCRIPTION OF THE DRAWINGS

Other aspects, aims, advantages and features of the invention will become more clearly apparent on reading the following detailed description of preferred embodiments thereof, which description is given by way of non-limiting example, with reference to the appended drawings, in which.

DETAILED DESCRIPTION OF PARTICULAR EMBODIMENTS

In the figures and in the rest of the description, identical or similar elements have been designated with the same references. In addition, the various elements are not shown to scale for the sake of clarity of the figures. Moreover, the various embodiments and variants are not exclusive from one another and may be combined together. Unless otherwise indicated, the terms "substantially", "about" and "of the order of" mean to within 10%, and preferably to within 5%. Moreover, the expression "comprised between . . . and . . . " and equivalents mean that the limits are included, unless otherwise mentioned.

Figure 1A:
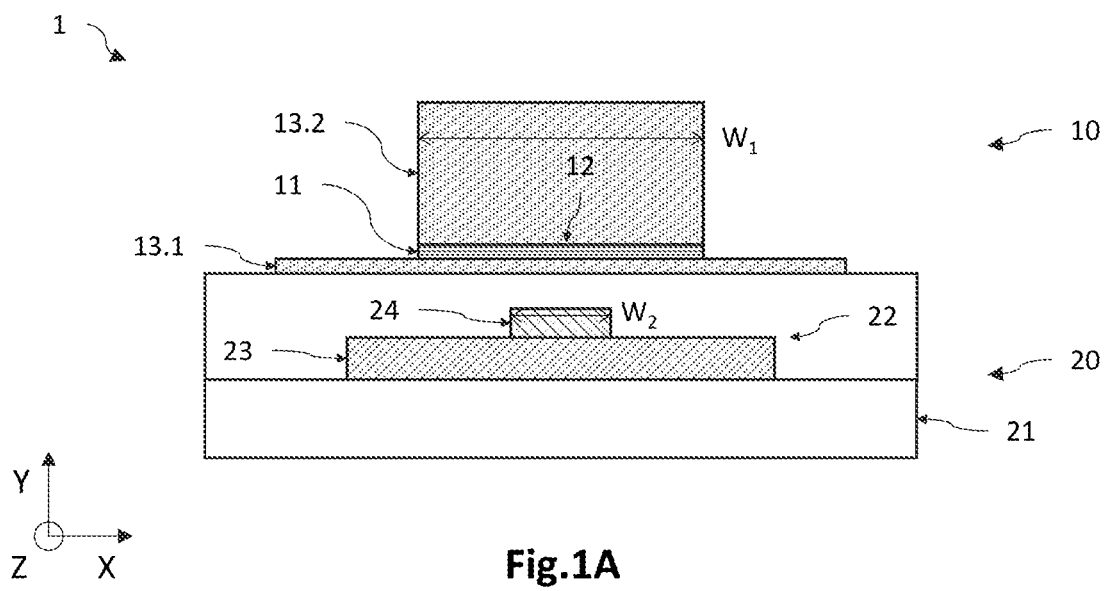
FIGS. 1A and 1B, which have already been described, are schematic and partial transverse (FIG. 1A) and longitudinal (FIG. 1B) cross-sectional views of a hybrid laser source according to one example of the prior art.
Figure 1B:
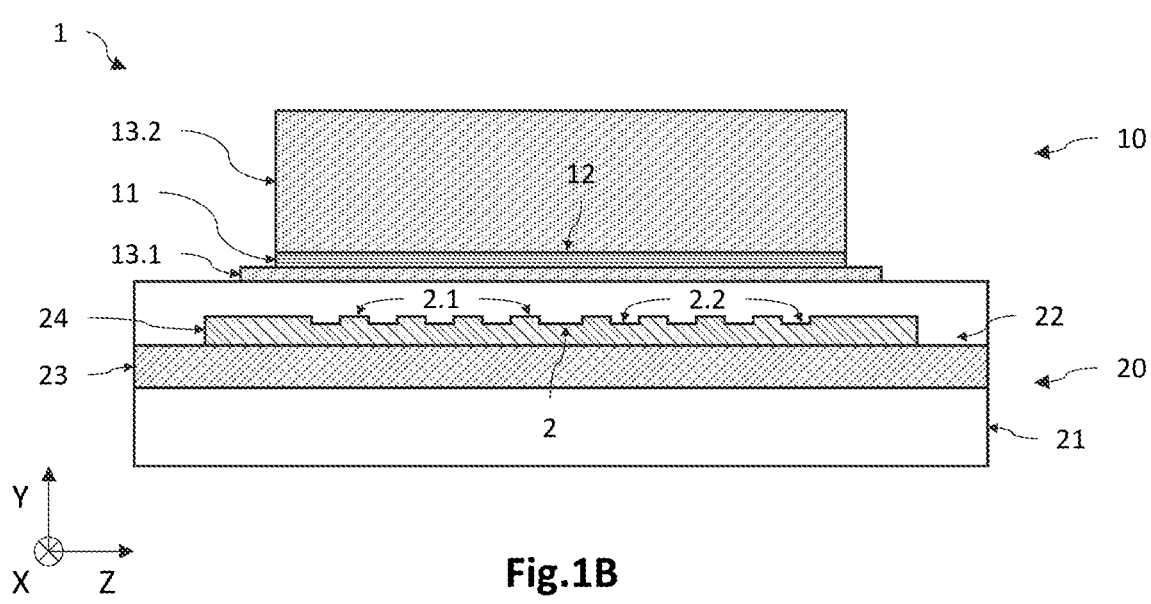

FIGS. 1A and 1B, which have already been briefly described above, are schematic and partial transverse (FIG. 1A) and longitudinal (FIG. 1B) cross-sectional views of a laser source 1 according to one example of the prior art.

Here, a three-dimensional orthogonal direct coordinate system XYZ, in which the XZ-plane is a plane parallel to the plane of the functionalized substrate 20, the Z-axis being oriented along the longitudinal axis of the active waveguide, the X-axis being oriented in the direction of the width of the waveguides, and the Y-axis being oriented from the functionalized substrate 20 toward the semiconductor pad 10 of the laser source 1, is defined; this coordinate system will be referred to in the rest of the description. In the rest of the description, the terms "lower" and "upper" are to be understood to be relative to positions of increasing height in the +Y-direction.

The laser source 1 is here a distributed-feedback (DFB) laser, but it may equally well be a DBR laser. It comprises a semiconductor pad 10 made of at least one semiconductor compound, here a III-V compound, and arranged on a functionalized substrate 20, here a silicon-on-insulator (SOI) substrate. The optical cavity is formed by a Bragg grating 2 located in the integrated waveguide 22, which extends longitudinally facing the active waveguide 12.

The semiconductor pad 10 contains the gain medium, which is located in a first waveguide, referred to as the active waveguide. It comprises a layer 11 containing an alternation of multiple quantum wells and barrier layers, the quantum wells for example being made of InGaAsP (or AlGaInAs), with a maximum gain for example centred on the wavelength A equal to 1310 nm. The quantum-well layer 11 is flanked along the Y-axis by n- and p-doped semiconductor layers, which are for example made of InP. Thus, the semiconductor pad 10 contains a PIN junction that extends parallel to the XZ plane. The active waveguide 12 comprises optical amplifying means for producing a stimulated light emission, here the quantum-well layer 11. It extends in a longitudinal direction, here along the Z-axis.

The functionalized substrate 20 is a carrier substrate of the semiconductor pad 10, and incorporates optical functions of a photonic circuit. It comprises to this end a second waveguide, referred to as the integrated waveguide, belonging to the integrated photonic circuit. The functionalized substrate 20 is here a silicon-on-insulator (SOI) substrate, so that the integrated waveguide 22 comprises a core made of silicon encircled by a silicon oxide forming a cladding. More precisely, the functionalized substrate 20 comprises: a base layer 21 made of silicon oxide; the integrated waveguide 22 made of silicon that rests on the base layer 21; and at least one layer of silicon oxide that encircles the integrated waveguide 22 and ensures a vertical spacing along the Y-axis between the latter and the semiconductor pad 10.

The integrated waveguide 22 comprises a first portion 23 that rests in contact with the base layer 21, and a second portion 24 that rests on the first portion 23. The first portion 23 is here made of crystalline silicon, and preferably of single-crystal silicon, and is formed from the layer of crystalline silicon of the SOI substrate. The second portion 24 may be made of amorphous silicon. It is therefore a question of a stack, along the Y-axis, of the first longitudinal portion 23 and of the second longitudinal portion 24, which portions extend longitudinally along the axis of the integrated waveguide 22. In this example, the integrated waveguide 22 is a rib guide. In other words, the first portion 23 forms a slab 23, and the second portion 24 forms a longitudinal rib. The longitudinal rib 24 is a narrow ridge that protrudes with respect to the slab 23 in the +Y-direction. The width W2 of the integrated waveguide 22 is here the width of the longitudinal rib 24 along the X-axis, which width is smaller than the width of the slab 23. The integrated waveguide 22 is spaced apart from the semiconductor pad 10 by an upper layer 26 of silicon oxide. The integrated waveguide 22 is oriented, in the region of optical coupling, parallel to the active waveguide 12, and is located perpendicular thereto along the Y-axis. The two waveguides are optically coupled to each other so as to support a hybrid optical mode.

The integrated waveguide 22 here comprises a Bragg grating 2 defining the optical cavity. The Bragg grating 2 is here distributed along at least one portion of the active waveguide 12 (DFB laser source). It is formed by a periodic alternation of teeth 2.1 and of troughs 2.2 that are formed in the upper face of the longitudinal rib 24 of the integrated waveguide 22. The troughs 2.2 are thus filled with the upper layer 26 of silicon oxide. Thus, the Bragg grating 2 is located on that face of the integrated waveguide 22 which is oriented toward the semiconductor pad 10.

Figure 2A:
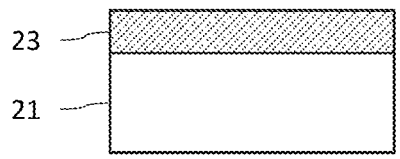
FIGS. 2Aa to 2Hb illustrate certain steps of a process for fabricating a laser source that is identical or similar to that illustrated in FIGS. 1A and 1B, highlighting a degradation in the performance of the Bragg grating.
Figure 2A:
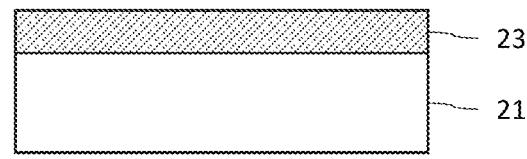

FIGS. 2Aa to 2Hb illustrate an example of a process for fabricating a hybrid laser source 1 similar to that described above with reference to FIGS. 1A and 1B. The figures contain one transverse cross-sectional view (left-hand side) of an XY-plane, and one longitudinal cross-sectional view (right-hand side) of a YZ-plane passing through the centre of the integrated waveguide 22.

FIGS. 2Aa and 2Ab illustrate a first step of producing the first portion 23 of the integrated waveguide 22, here the slab 23. The slab 23 is produced by structuring a layer of single-crystal silicon of an SOI substrate. It has a thickness H1 equal to that of the layer of single-crystal silicon, for example of about 300 nm, and rests on a thick layer of silicon oxide, of SiO2 for example, of a thickness of the order of a few tens to a few hundred microns. The slab 23 may have a width W1 for example equal to 10 μm and is encircled laterally, in the XZ-plane, by a layer of silicon oxide (not shown).

Figure 2B:
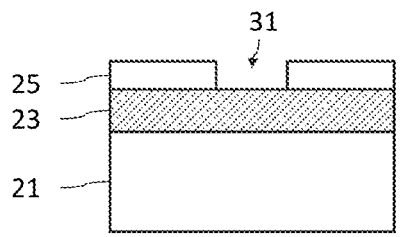
Figure 2B:
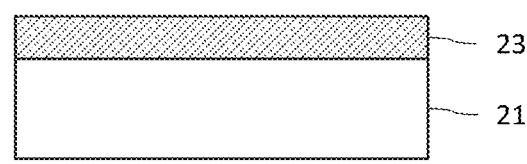

FIGS. 2Ba and 2Bb illustrate the production of a longitudinal aperture 31 in an intermediate layer 25, with a view to forming the longitudinal rib 24. To this end, an intermediate layer 25, made of silicon oxide for example, is deposited so as to cover the slab 23, and a longitudinal aperture 31 that opens onto a surface of the single-crystal silicon is produced by photolithography. The aperture extends longitudinally along the Y-axis. The longitudinal aperture 31 has a depth corresponding to the desired height H2 of the longitudinal rib 24, for example here about 200 nm. The width of the longitudinal aperture 31 along the X-axis defines the width W2 of the longitudinal rib 24, and may be equal to about 3 μm.

Figure 2C:
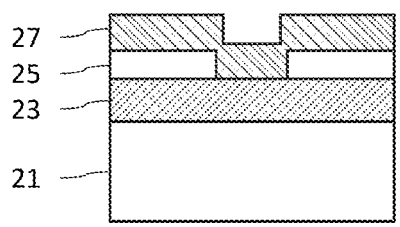
Figure 2C:
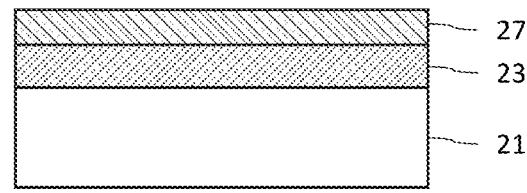

FIGS. 2Ca and 2Cb illustrate the deposition of amorphous silicon. To do this, a wafer-scale deposition of a layer 27 of amorphous silicon is carried out so as to entirely fill the longitudinal aperture 31 formed in the intermediate layer 25.

Figure 2D:
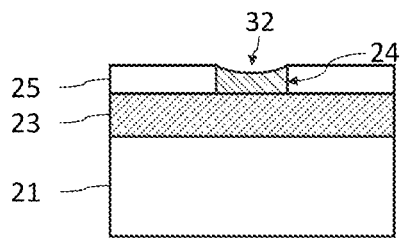
Figure 2D:
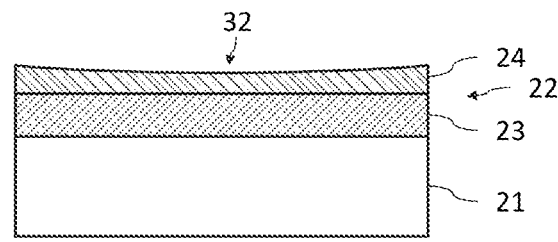

FIGS. 2Da and 2Db illustrate planarization, by chemical-mechanical polishing (CMP), of the deposited amorphous silicon, so as to preserve the amorphous silicon located in the longitudinal aperture 31, and to remove the amorphous silicon resting on the upper face of the intermediate layer 25. A longitudinal rib 24 made of amorphous silicon of a width W2 of about 3 μm and of a thickness H2 of the order of about 200 nm is thus obtained, resting in contact with the slab 23 made of single-crystal silicon of a width W1 of about 10 μm and of a thickness of about 300 nm.

However, the inventors have observed that this step of planarization by CMP may lead to the formation of dishing 32 in the segment of amorphous silicon located in the longitudinal aperture 31. In other words, a concavity is formed in the segment of amorphous silicon, from its upper face, this causing the thickness H2 to vary in the XZ-plane. Thus, the thickness H2 has a value substantially equal to about 200 nm on the border of the longitudinal rib 24, and decreases in the direction of the centre of the longitudinal rib 24. The dishing 32 may have a maximum value of about a few tens of nanometres, about 25 nm for example, this being of the same order of magnitude as the depth of the troughs 2.2 of the Bragg grating 2 (between about 10 nm for a DBR source and about 50 nm for a DFB source).

Figure 2E:
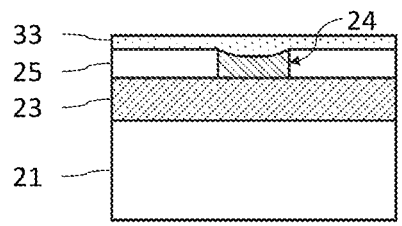
Figure 2E:
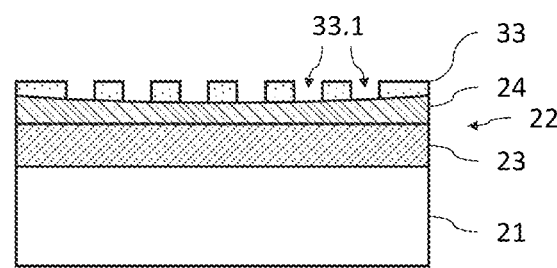

FIGS. 2Ea to 2Fb illustrate production of the Bragg grating 2 in the longitudinal rib 24 of the integrated waveguide 22 from the upper face of the longitudinal rib 24. To this end, an etch mask 33 is deposited so as to cover the longitudinal rib 24 and holes 33.1, here through-holes, intended for production of the Bragg grating 2 are produced. The material of the etch mask 33 may be, inter alia, a silicon nitride. A dry RIE etch is then performed so as to form the Bragg grating 2 in the longitudinal rib 24 from its upper face, and the etch mask 33 is entirely removed. The Bragg grating 2 is then formed from a periodic alternation of troughs 2.2 and teeth 2.1.

In this example, the depth of the troughs 2.2 is of the order of about 50 nm; however, as may be seen, because of the dishing 32 caused by the CMP planarization, it is not uniform in the XZ-plane. An undesired spatial non-uniformity in the dimensions of the patterns of the Bragg grating 2, which may lead to a degradation of the performance of the Bragg grating 2 and therefore of the laser source 1, results therefrom.

Figure 2F:
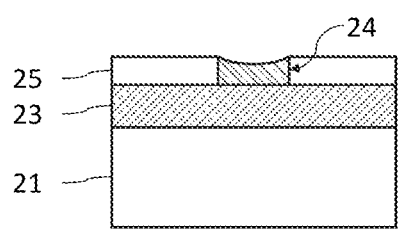
Figure 2F:
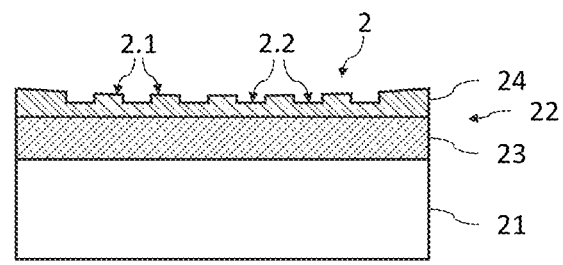
Figure 2G:
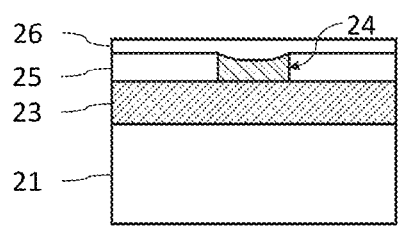
Figure 2G:
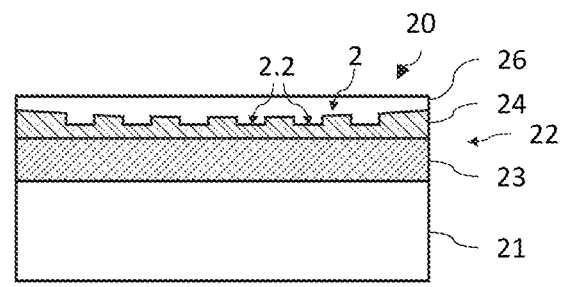

FIGS. 2Ga and 2Gb illustrate the deposition of the upper layer 26 of silicon oxide, so as to entirely cover the intermediate layer 25 of silicon oxide and the longitudinal rib 24 of amorphous silicon. This upper layer 26 ensures the spacing between the integrated waveguide 22 and the semiconductor pad 10, and may have a thickness for example equal to about 100 nm (and preferably comprised between about 80 nm and 140 nm).

Figure 2H:
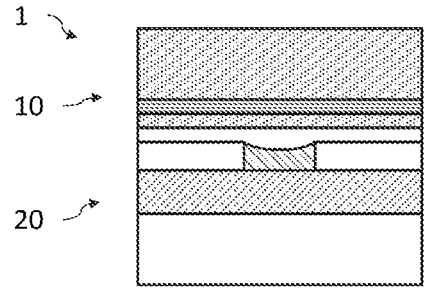
Figure 2H:
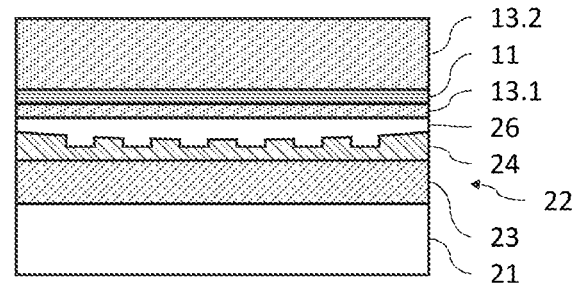

FIGS. 2Ha and 2Hb illustrate the production of the semiconductor pad 10 on the functionalized substrate 20. In a known way, an assembly is produced by bonding a stack of, here III-V, semiconductor layers containing quantum wells to the functionalized substrate 20. Steps of structuring the semiconductor stack are then performed to obtain the semiconductor pad 10 of desired size. The known steps of encapsulating the semiconductor pad 10 with a passivation layer and of producing the biasing electrodes are not described.

Hence, this process for fabricating a laser source 1 that is identical or similar to the one illustrated in FIGS. 1A and 1B, which employs a damascene process (filling of the longitudinal aperture 31 then chemical-mechanical polishing), may lead to dishing 32 in the deposited amorphous silicon intended to form the longitudinal rib 24. This dishing 32, which results in a spatial non-uniformity in the thickness of the amorphous silicon, causes the dimensions of the Bragg grating 2 to be non-uniform in the XZ-plane. The performance of the Bragg grating 2 and hence of the laser source 1 may therefore be degraded.

Moreover, with reference to FIGS. 2Fa and 2Fb, the inventors have observed that, following production of the patterns of the Bragg grating 2, transverse physical contact, i.e. contact along the X-axis, may be interrupted locally between the amorphous silicon of the teeth 2.1 and the silicon oxide of the intermediate layer 25. This lack of physical contact between the materials results in the presence of empty regions on either side of the teeth 2.1 along the X-axis, at the interface between the teeth 2.1 made of amorphous silicon and the intermediate layer 25 made of silicon oxide. These empty regions may lead to optical losses that degrade the performance of the integrated waveguide 22, and therefore also that of the laser source (and notably to an undesirable alteration of the emission wavelength).

Thus, to preserve the performance of the Bragg grating 2 during the fabricating process, and thus to obtain a Bragg grating 2 the dimensions of the teeth 2.1 and of the troughs 2.2 remain uniform in the XZ-plane, the Bragg grating 2 of the laser source 1 according to the invention is located between the first portion 23 and the second portion 24 of the integrated waveguide 22 and is formed from the upper face of the first portion 23. Thus a Bragg grating 2, referred to as the intermediate grating, is obtained. In addition, this arrangement of the Bragg grating 2 within the integrated waveguide 22 allows the formation of empty regions located at the interface between the teeth 2.1 and the intermediate layer 25 to be avoided.

Figure 3A:
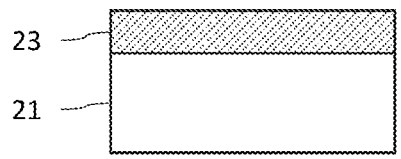
FIGS. 3Aa to 3Hb, 3I and 3J illustrate certain steps of a process for fabricating a laser source according to one embodiment.
Figure 3A:
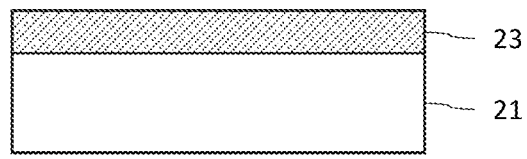

FIGS. 3Aa to 3Hb, 3I and 3J illustrate a process for fabricating a hybrid laser source 1 according to one embodiment. In this example, the laser source 1 is a DFB source, but it could equally well be a DBR source. Each figure contains one transverse cross-sectional view (left-hand side) of an XY-plane, and one longitudinal cross-sectional view (right-hand side) of a YZ-plane passing through the centre of the integrated waveguide 22. The laser source 1 according to this embodiment differs from the one described with reference to FIGS. 1A and 1B essentially in that the Bragg grating 2 is arranged in the first portion 23 in the upper face thereof, and not in the second portion 24. In this example, since the integrated waveguide 22 is a rib guide, the first portion 23 is a slab 23 and the second portion 24 is the longitudinal rib 24.

FIGS. 3Aa and 3Ab illustrate a first step of producing the slab 23 of the integrated waveguide 22. The slab 23 is formed by structuring a layer of crystalline silicon of an SOI substrate, so that it has a thickness H1 equal to that of the silicon layer of an SOI substrate, for example about 300 nm. It rests on a thick layer of silicon oxide, for example of $SiO_2$, of a thickness for example comprised between 720 nm and a few microns. This step is similar or identical to that described above with reference to FIG. 2A.

Figure 3B:
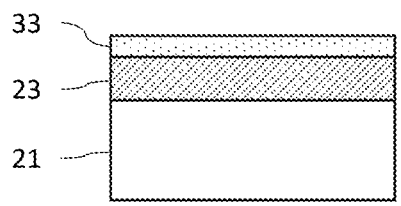
Figure 3B:
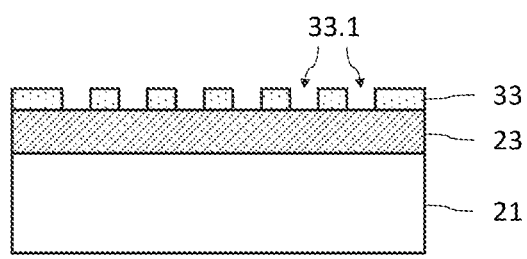

FIGS. 3Ba, 3Bb, 3Ca and 3Cb illustrate the production of the Bragg grating 2 in the slab 23 made of crystalline silicon from its upper face. To this end, an etch mask 33 (for example of $Si_3N_4$) is deposited so as to cover the slab 23, and holes 33.1, here through-holes, intended for the production of the Bragg grating 2 are produced. Dry RIE etching is then performed so as to form the Bragg grating 2 in the slab 23 made of crystalline silicon from its upper face, and the etch mask 33 is entirely removed.

In so far as the slab 23 made of crystalline silicon is obtained from the silicon layer of the SOI substrate and is not formed using a damascene process, it has a thickness H1 that is substantially uniform in the XZ-plane. Thus, the dimensions of the patterns of the Bragg grating 2 are uniform in the XZ-plane.

Figure 3C:
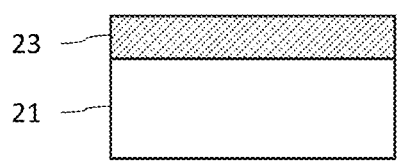
Figure 3C:
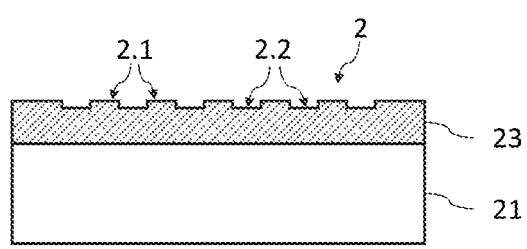
Figure 3D:
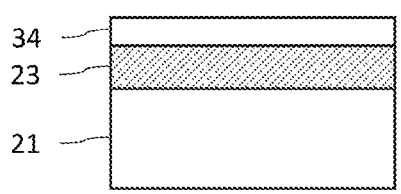
Figure 3D:
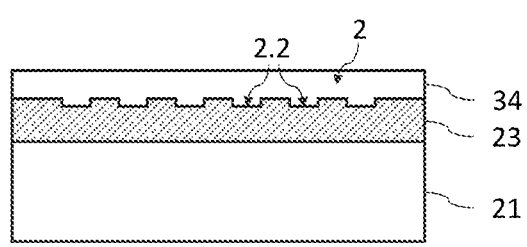

FIGS. 3Da and 3Db illustrate the deposition of a filling layer 34 made of a low-index material, for example a silicon oxide or a silicon nitride. Here, a silicon oxide is deposited, and covers the slab 23 and therefore entirely fills the troughs 2.2 of the Bragg grating 2. The filling layer 34 is advantageously made of silicon oxide, and may thus participate in the production of the longitudinal rib 24 while forming subsequently the intermediate layer 25, which then encircles the longitudinal rib 24 in the XZ-plane.

Figure 3E:
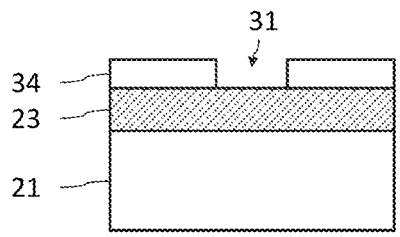
Figure 3E:
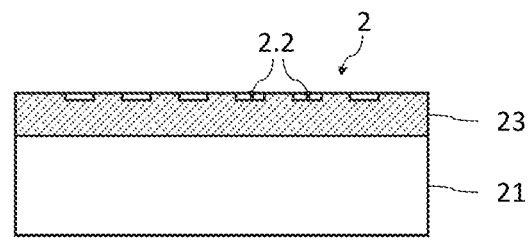

FIGS. 3Ea and 3Eb illustrate the production of a longitudinal aperture 31 in the filling layer 34, this aperture being intended for production of the longitudinal rib 24 made of amorphous silicon of the integrated waveguide 22. The longitudinal aperture 31 is here produced by dry etching with the end-point of the etching detected via the crystalline silicon of the slab 23. The longitudinal aperture 31 is therefore here a through-aperture, so that the upper face of the teeth 2.1 made of crystalline silicon is freed whereas the troughs 2.2 of the Bragg grating 2 remain filled with the low-index material, here silicon oxide.

Figure 3F:
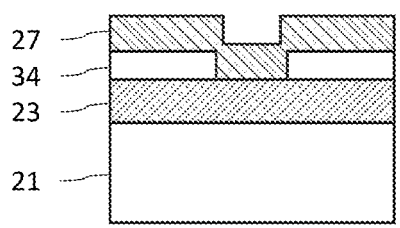
Figure 3F:
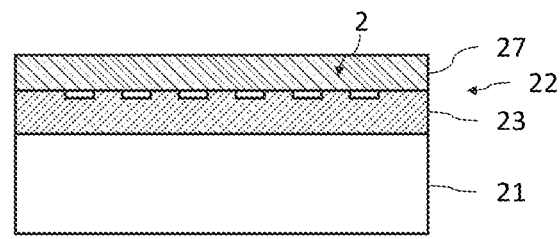

FIGS. 3FGa and 3Fb illustrate the deposition of amorphous silicon. To this end, a wafer-scale deposition of a layer 27 of amorphous silicon is carried out so as to entirely fill the longitudinal aperture 31 formed in the intermediate layer 25 of silicon oxide. The amorphous silicon therefore makes contact with the crystalline silicon of the teeth 2.1 of the Bragg grating 2 and with the silicon oxide filling the troughs 2.2.

Figure 3G:
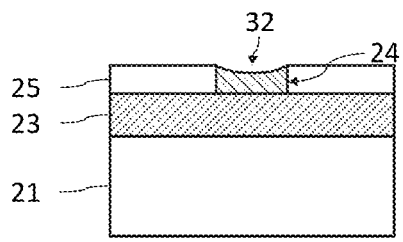
Figure 3G:
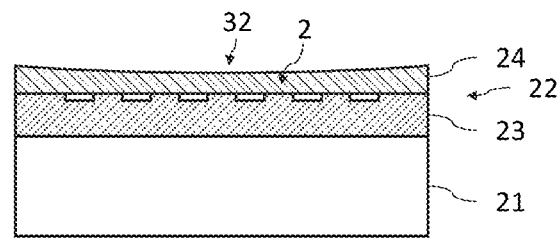

FIGS. 3Ga and 3Gb illustrate the planarization by chemical-mechanical polishing (CMP) of the deposited amorphous silicon, so as to preserve the amorphous silicon located in the longitudinal aperture 31 in the layer of silicon oxide and to remove the amorphous silicon resting on the upper face of the filling layer 34. In this example, since the filling layer 34 is a silicon oxide, it is advantageously preserved and forms the intermediate layer 25 that participates in encircling the integrated waveguide 22 in the XZ-plane. This step of planarization by CMP may lead to the formation of dishing 32 in the longitudinal ridge 24 of amorphous silicon. Said ridge therefore exhibits a thickness non-uniformity in the XZ-plane. However, unlike the process described above, this non-uniformity in the thickness of the amorphous silicon planarized by CMP has no impact on the dimensions and therefore on the performance of the Bragg grating 2.

Figure 3H:
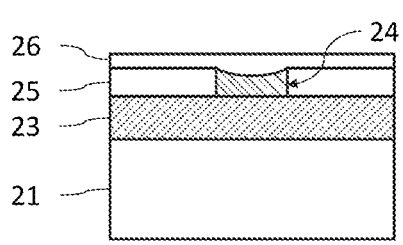
Figure 3H:
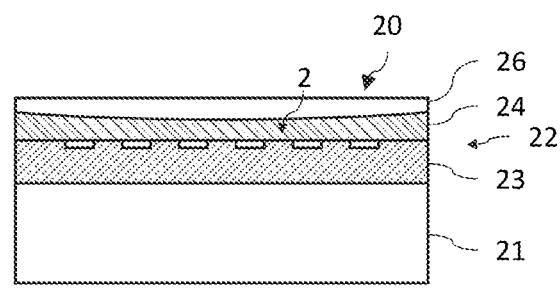

FIGS. 3Ha and 3Hb illustrate the deposition of the upper layer 26 of silicon oxide, so as to entirely cover the intermediate layer 25 of silicon oxide and the longitudinal rib 24 of amorphous silicon. This upper layer 26 ensures the spacing between the integrated waveguide 22 and the semiconductor pad 10, and may have a thickness for example equal to about 100 nm.

Figure 3I:
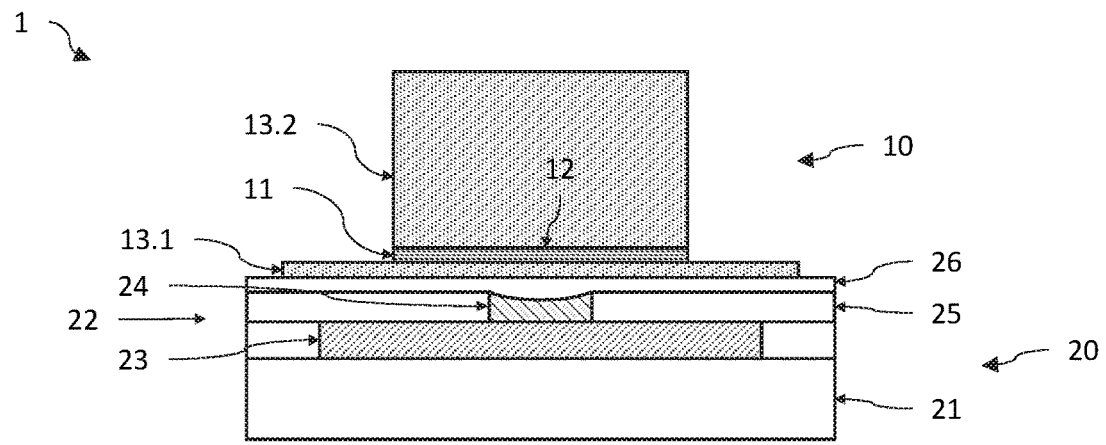
Figure 3I:
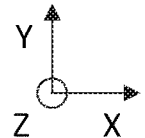
Figure 3J:
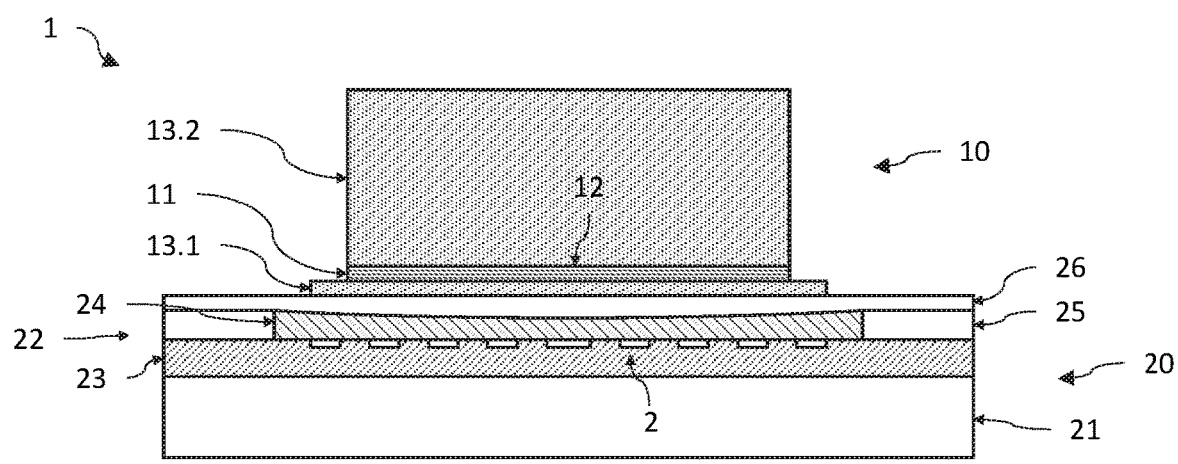
Figure 3J:
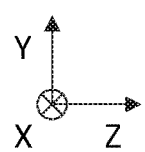

FIGS. 3I and 3J illustrate the production of the semiconductor pad 10 on the functionalized substrate 20. In a known way, an assembly is produced by bonding a stack of, here III-V, semiconductor layers containing quantum wells to the functionalized substrate 20. Steps of structuring the semiconductor stack are then performed to obtain the semiconductor pad 10 of desired size and comprising an active waveguide 12.

Therefore, as a result, by arranging the Bragg grating 2 in the first portion 23 of the integrated waveguide 22 (here the slab 23), and more precisely in its upper face, the dishing 32 that may be formed in the CMP step is prevented from degrading the uniformity of the dimensions of the patterns of the Bragg grating 2. Moreover, the risk of loss of lateral contact between the teeth 2.1 made of crystalline silicon of the Bragg grating 2 and the intermediate layer 25 made of silicon oxide is avoided. Thus, the performance of the Bragg grating 2 and therefore that of the laser source 1 is preserved.

Figure 4A:
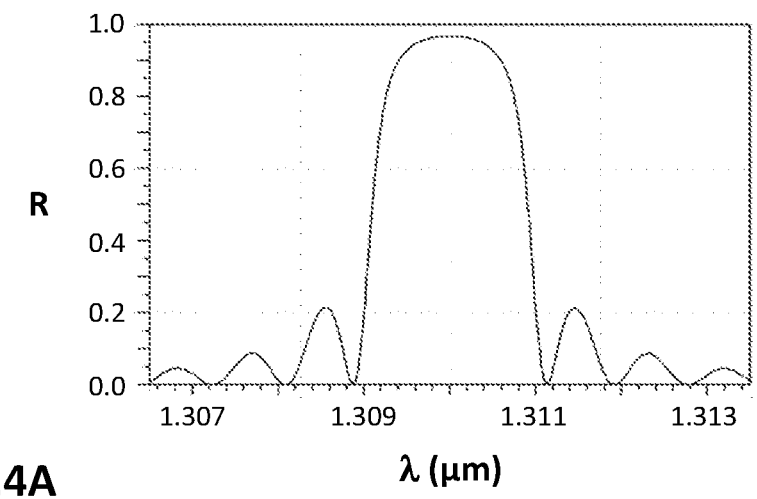
FIGS. 4A to 4C are examples of spectral reflectivity responses of various integrated waveguides comprising a Bragg grating.
Figure 4B:
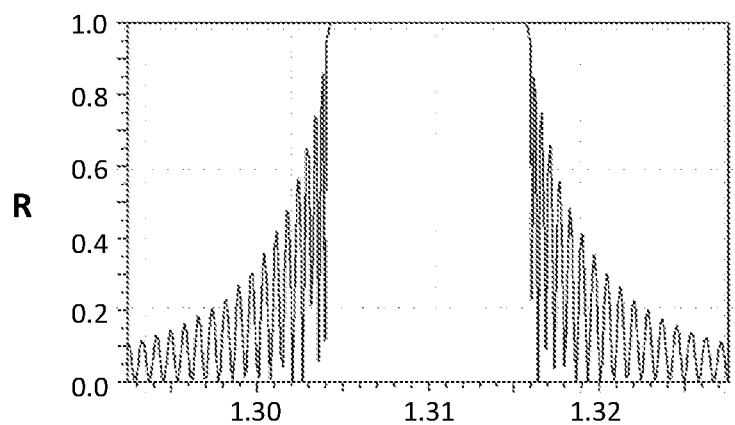
Figure 4C:
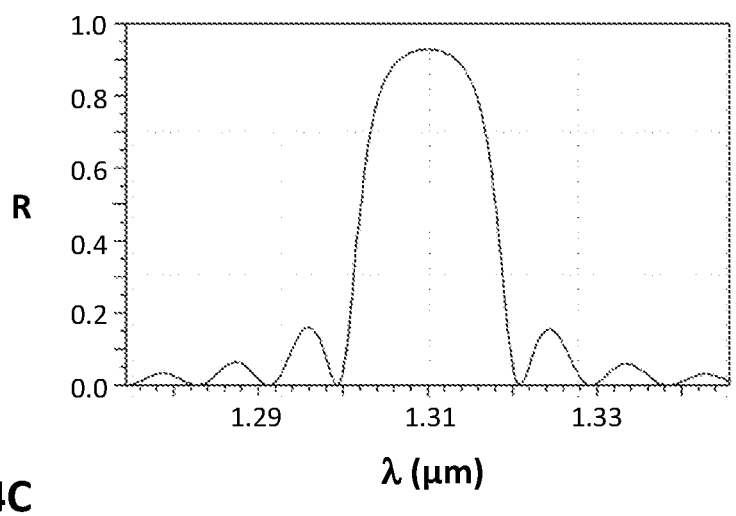

FIGS. 4A to 4C illustrate examples of spectral reflectivity response of various Bragg gratings.

FIG. 4A corresponds to an integrated waveguide 22 that is identical or similar to that described with reference to FIGS. 1A and 1B. It is formed from a slab 23 made of single-crystal silicon of a width W1 of 10 μm and of a thickness H1 of 300 nm. It is covered locally with a longitudinal rib 24 made of amorphous silicon of a width W2 of 3 μm and of a thickness H2 of 200 nm. It is encircled by $SiO_2$. The Bragg grating 2 is located in the upper face of the longitudinal rib 24, and is therefore not an intermediate Bragg grating 2. It is formed from a periodic alternation of troughs 2.2 of a depth of 10 nm and of a width here equal to W2 along the X-axis, and of teeth 2.1 of a dimension along the Z-axis of $P=\lambda/2n_{eff}$, i.e. equal to about 200 nm, P being the period of the Bragg grating and $n_{eff}$ the effective index of the optical mode ($n_{eff} \approx 3.29$ for the hybrid III-V/silicon mode). Along the Z-axis, the troughs 2.2 and the teeth 2.1 preferably have a fill factor of 50% (P/2). The wavelength of the guided mode is here 1.31 μm. It may be seen that, for such a Bragg grating 2 of a length of 300 μm, the spectral reflectivity response (as estimated using the commercially available simulation software package GratingMOD from Rsoft) has a peak of a maximum value of 97% and a full width at half maximum of 1.8 nm.

FIG. 4B corresponds to an integrated waveguide 22 that is identical or similar to that described with reference to FIGS. 3I and 3J, i.e. an integrated waveguide that comprises an intermediate Bragg grating 2. The integrated waveguide 22 is formed from a slab 23 made of crystalline silicon of a width W1 of 10 μm and of a thickness H1 of 300 nm. The Bragg grating 2 is formed in the upper face of the slab 23. It has the same dimensions as that of FIG. 4A, and the troughs 2.2 are filled with $SiO_2$. The longitudinal rib 24 made of amorphous silicon covers the slab 23 and the Bragg grating 2. It has a width W2 of 3 μm and a thickness H2 of 200 nm. It may be seen that, for such a Bragg grating 2 of a length of 300 μm and a wavelength of 1.31 μm, the spectral reflectivity response has a higher peak, equal to 100% and a larger full width at half maximum of 12 nm.

FIG. 4C corresponds to an integrated waveguide 22 that is similar to that described with reference to FIG. 4B, i.e. an integrated waveguide that comprises an intermediate Bragg grating 2, and that differs therefrom only in that it has a length of 30 μm. The spectral reflectivity response of such a grating here has a peak equal to 93% and a full width at half maximum of 16 nm.

Thus, depending on the targeted application, the performance of an integrated waveguide 22 comprising an intermediate Bragg grating 2 located between the first portion 23 and the second portion 24 may be improved while the length of the grating is kept the same, or may be kept broadly the same while the length of the grating is decreased.

Figure 5A:
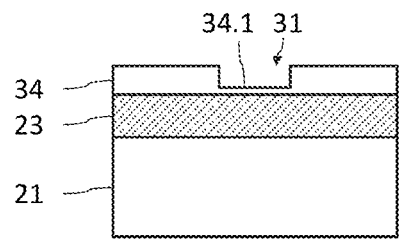
FIGS. 5Aa to 5Db illustrate various steps of a process for fabricating a laser source according to one variant embodiment.
Figure 5A:
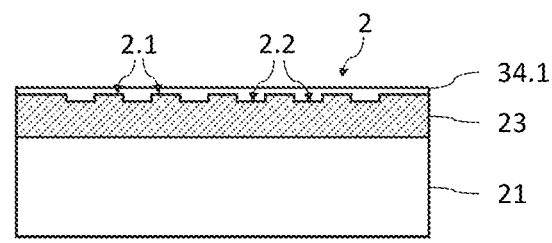

FIGS. 5Aa to 5Db illustrate certain steps of a process for fabricating a laser source 1 according to one variant embodiment. The laser source 1 according to this embodiment differs from that described with reference to FIGS. 3Aa and 3Ab and the related figures essentially in that the integrated waveguide 22 comprises a thin continuous layer 34.1 made of low-index material arranged at the interface between the first portion 23 and the second portion 24.

The fabricating process comprises steps of producing a slab 23 made of crystalline silicon from an SOI substrate, of producing the etch mask 33 containing holes 33.1, of etching the etch mask 33 and producing the Bragg grating 2 in the slab 23, and of depositing a filling layer 34 made of a low-index material. These steps are identical or similar to those described with reference to FIGS. 3Aa to 3Db and are not described again.

FIGS. 5Aa and 5Ab illustrate the production of a longitudinal aperture 31 in the filling layer 34, which aperture is intended for the production of the longitudinal rib 24 made of amorphous silicon of the integrated waveguide 22. The longitudinal aperture 31 is here produced by dry etching that is stopped in time, so as not to produce a through-aperture but to preserve a thin continuous layer 34.1 that covers the upper face of the slab 23 made of crystalline silicon. Thus, the teeth 2.1 made of crystalline silicon remain covered by the thin continuous layer 34.1, which still fills the troughs 2.2 of the Bragg grating 2. The thin continuous layer 34.1 has a thickness chosen so as to be optically neutral with respect to the guided optical mode. To this end, it has a thickness on the teeth 2.1 of the Bragg grating 2 that is preferably smaller than or equal to 20 nm. Moreover, it has a substantially planar upper face.

Figure 5B:
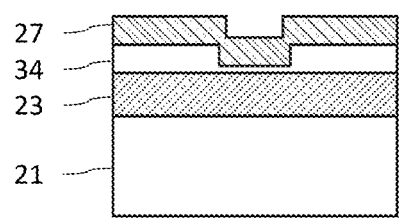
Figure 5B:
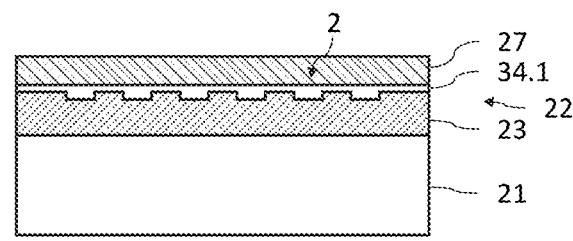
Figure 5C:
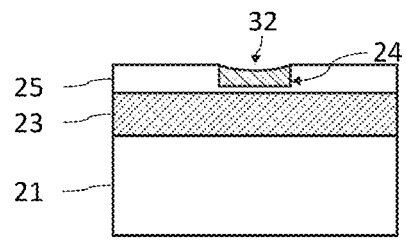
Figure 5C:
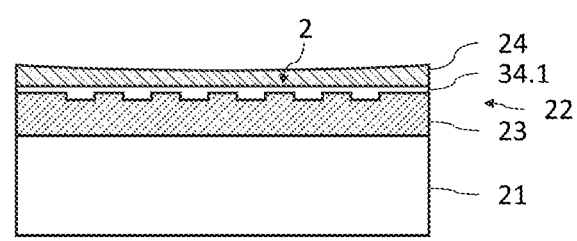
Figure 5D:
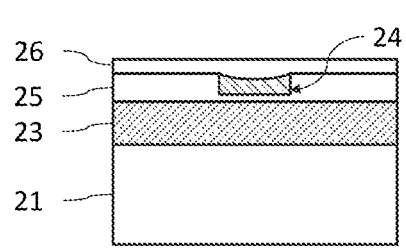
Figure 5D:
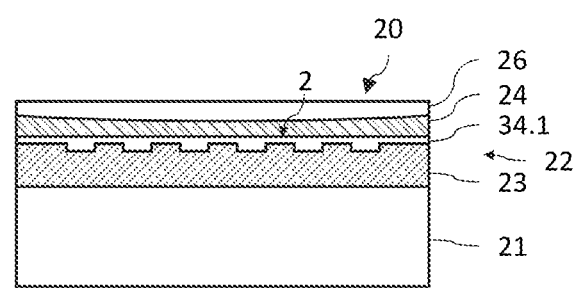

FIGS. 5B, 5C and 5D 5Ba to 5Db are steps of depositing amorphous silicon, of CMP planarization then of depositing the upper layer 26 made of silicon oxide, respectively. These steps are identical or similar to those described above.

Thus, an integrated waveguide 22 formed from a first portion 23 made of crystalline silicon containing an intermediate Bragg grating 2 located in its upper face, from a thin continuous layer 34.1 made of a low-index material that fills the troughs 2.2 of the Bragg grating 2 and covers the first portion 23, and from a second portion 24 made of amorphous silicon that rests in contact with the thin continuous layer 34.1 is obtained.

Figure 6A:
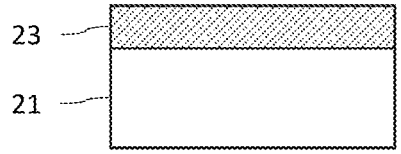
FIGS. 6Aa to 6Db illustrate various steps of a process for fabricating a laser source according to another variant embodiment.
Figure 6A:
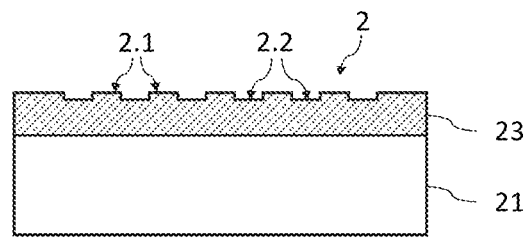

FIGS. 6Aa to 6Db illustrate certain steps of a process for fabricating a laser source 1 according to another variant embodiment. The laser source 1 according to this embodiment differs from that described with reference to FIG. 3A and the associated figures essentially in that the troughs 2.2 of the Bragg grating 2 are filled with a silicon nitride and not with a silicon oxide.

The fabricating process comprises steps of producing a slab 23 made of crystalline silicon from an SOI substrate, and of producing the etch mask 33 containing holes 33.1. These steps are identical or similar to those described with reference to FIGS. 3Aa to 3Bb and are not described again.

FIGS. 6Aa and 6Ab illustrate the structure obtained following the step of etching the etch mask 33 and of producing the Bragg grating 2 in the slab 23. This step is similar to that described with reference to FIGS. 3Ca and 3Cb.

Figure 6B:
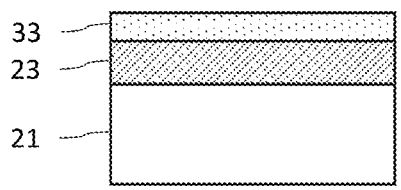
Figure 6B:
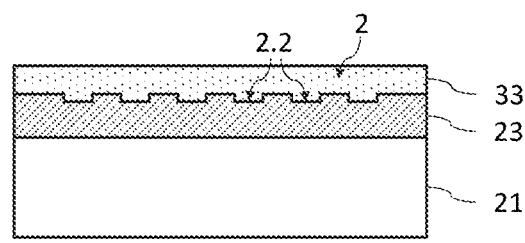

FIGS. 6Ba and 6Bb illustrate the deposition of a filling layer 34 made of a low-index material different from silicon oxide, silicon nitride for example. The silicon nitride covers the slab 23 and therefore entirely fills the troughs 2.2 of the Bragg grating 2.

Figure 6C:
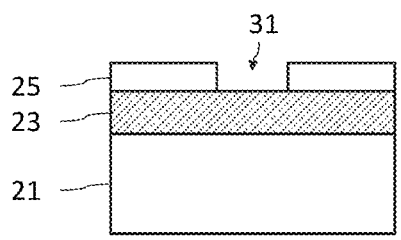
Figure 6C:
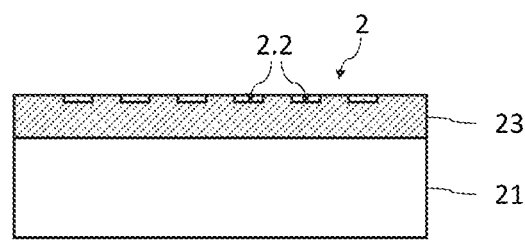

FIGS. 6Ca and 6Cb illustrate the production of a longitudinal aperture 31 in an intermediate layer 25 of silicon oxide. Beforehand, the filling layer 34 is thinned by CMP until the upper surface of the teeth 2.1 made of crystalline silicon is freed. The troughs 2.2 of the Bragg grating 2 remain filled with the silicon nitride. An intermediate layer 25 made of silicon oxide is then deposited so as to cover the slab 23, then a longitudinal aperture 31 is produced by dry etching, for example RIE, with the end-point of the etching detected via the crystalline silicon of the slab 23. Potential over-etching of the silicon nitride located in the troughs 2.2 of the Bragg grating 2 is thus limited.

Figure 6D:
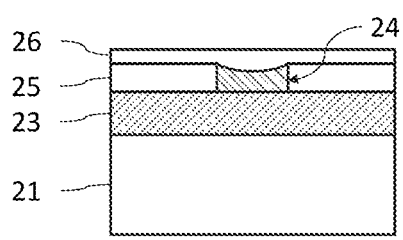
Figure 6D:
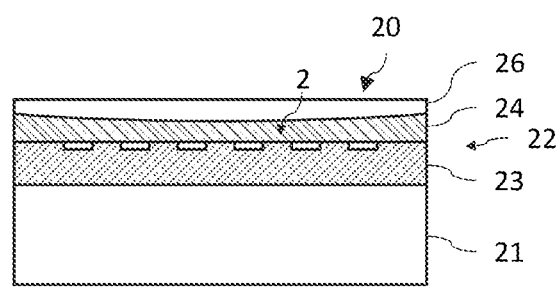

FIGS. 6Da and 6Db illustrate the structure obtained after the steps of depositing amorphous silicon, of planarization by CMP and of depositing the upper layer 26 made of silicon oxide. These steps are similar to those described with reference to FIGS. 3Fa to 3Hb.

Thus, an integrated waveguide 22 formed from a first portion 23 made of crystalline silicon containing an intermediate Bragg grating 2 located in its upper face, the troughs 2.2 of the Bragg grating 2 being filled with a silicon nitride, and from a second portion 24 made of amorphous silicon that rests in contact with the thin continuous layer 34.1 is obtained. Thus there is no need to have a thin continuous layer 34.1 located at the interface between the first and second portions 23, 24 of the integrated waveguide 22, and the risk of over-etching the low-index material located in the troughs 2.2 of the Bragg grating 2 is limited.

Particular embodiments have just been described. Various variants and modifications will appear obvious to those skilled in the art.

The integrated waveguide 22 described above is a rib waveguide. As a variant, the integrated waveguide 22 could be a slab waveguide, i.e. a waveguide formed from a first portion 23 and second portion 24 having the same width along the longitudinal axis. Likewise, the second portion 24 may have a local width larger than that of the first portion 23 (inverted rib waveguide).

The laser source described above was a DFB source but it could have been a DBR source. In this case, two Bragg gratings would be placed on either side of the semiconductor pad 10 in order to define the optical cavity of the laser source.

The invention claimed is:

1. A laser source, comprising:
    a functionalized substrate, comprising an integrated waveguide, said integrated waveguide:
        being formed from a stack of a first portion and of a second portion, an upper face of the first portion being at least partially coated with the second portion, and
        comprising at least one Bragg grating; and
    a semiconductor pad, resting on the functionalized substrate, comprising a gain medium located in an active waveguide, the active waveguide being located perpendicular to the integrated waveguide and oriented parallel thereto, the two waveguides being optically coupled to each other, wherein
    the Bragg grating is located in the upper face of the first portion,
    the Bragg grating is covered by the second portion,
    the second portion does not comprise a Bragg grating, and
    the second portion forms a longitudinal rib of a width smaller than that of the first portion.

2. The laser source according to claim 1, wherein the Bragg grating is formed by a periodic alternation of teeth and troughs, the teeth being filled with a material of low refractive index, the refractive index of which is lower than the refractive index of the first and second portions.

3. The laser source according to claim 1, wherein the second portion rests on a substantially planar surface.

4. The laser source according to claim 1, wherein the integrated waveguide is made of silicon and is covered by a silicon oxide, and wherein the Bragg grating comprises troughs filled with a silicon oxide or with a silicon nitride.

5. The laser source according to claim 1, wherein the first portion of the integrated waveguide is made of crystalline silicon, and the second portion is made of amorphous silicon.

6. The laser source according to claim 1, wherein the Bragg grating comprises a periodic alternation of teeth and troughs, the second portion making contact with the teeth of the Bragg grating.

7. The laser source according to claim 1, wherein the Bragg grating comprises a periodic alternation of teeth and troughs, the integrated waveguide comprising a thin continuous layer made of a material of low refractive index that covers the first portion and fills the troughs of the Bragg grating, the second portion being spaced apart from the first portion by the thin continuous layer.

8. A process for fabricating a laser source according to claim 1, comprising the following steps:
    producing a first portion of the integrated waveguide resting on a base layer;
    producing at least one Bragg grating in the upper face of the first portion opposite the base layer, the Bragg grating being formed from an alternation of teeth and troughs;
    filling the troughs with a material of low refractive index;
    producing a second portion of the integrated waveguide on the first portion and covering the Bragg grating;
    producing an upper layer covering the second portion; and producing the semiconductor pad resting on the upper layer.

9. The fabricating process according to claim 8, wherein the step of producing the first portion is performed by locally etching a layer of crystalline silicon of an SOL substrate, the first portion having a spatially uniform thickness equal to the thickness of the layer of crystalline silicon.

10. The fabricating process according to claim 8, wherein the step of producing the second portion of the integrated waveguide is performed using a damascene process comprising the following steps:
producing a layer forming a mask and covering the first portion and the Bragg grating;
producing a longitudinal aperture perpendicular to the Bragg grating;
depositing amorphous silicon filling the longitudinal aperture; and
carrying out chemical-mechanical planarization so as to free an upper face of the mask and to preserve the amorphous silicon filling the longitudinal aperture.

11. The fabricating process according to claim 10, the Bragg grating being formed from a periodic alternation of teeth and troughs, wherein, following the step of producing the longitudinal aperture, a surface of the upper face of the first portion is rendered free, said free surface being formed by teeth made of silicon and by the material of low refractive index filling the troughs of the Bragg grating.

12. The fabricating process according to claim 10, the Bragg grating being formed from a periodic alternation of teeth and troughs, wherein, following the step of producing the longitudinal aperture, a thin continuous layer of the layer made of silicon oxide covers the teeth made of silicon and fills the troughs of the Bragg grating.

13. The fabricating process according to claim 8, wherein producing the second portion of the integrated waveguide comprises dishing an upper surface of the second portion.

14. The fabricating process according to claim 8, wherein the step of producing the second portion of the integrated waveguide is performed using a damascene process comprising the following steps:
producing a layer forming a mask and covering the first portion and the Bragg grating;
producing a longitudinal aperture perpendicular to the Bragg grating;
depositing amorphous silicon filling the longitudinal aperture; and
carrying out chemical-mechanical planarization to expose the mask and create a dished upper surface in the amorphous silicon.

15. The laser source according to claim 1, comprising the second portion having a dished upper face.

16. The laser source according to claim 1, wherein:
the Bragg grating comprises a plurality of recesses, and
a depth of the recesses is less than a thickness of the second portion in a depth direction of the recesses.

17. A laser source, comprising:
a functionalized substrate, comprising an integrated waveguide, said integrated waveguide:
being formed from a stack of a first portion and of a second portion, an upper face of the first portion being at least partially coated with the second portion, and
comprising at least one Bragg grating; and
a semiconductor pad, resting on the functionalized substrate, comprising a gain medium located in an active waveguide, the active waveguide being located perpendicular to the integrated waveguide and oriented parallel thereto, the two waveguides being optically coupled to each other,
the Bragg grating being located in the upper face of the first portion, and being covered by the second portion and having a first length in a longitudinal direction,
the semiconductor pad having a second length in the longitudinal direction less than the first length,
the second portion does not comprise a Bragg grating, and
the second portion forms a longitudinal rib of a width smaller than that of the first portion.

18. The laser source according to claim 17, comprising the upper face of the second portion being dished and having a third length in the longitudinal direction greater than the second length.

19. The laser source according to claim 18, comprising the third length being substantially the same as the first length.

* * * * *